United States Patent
Vo

(10) Patent No.: US 8,625,385 B2
(45) Date of Patent: *Jan. 7, 2014

(54) DATA CAPTURE SYSTEM AND METHOD, AND MEMORY CONTROLLERS AND DEVICES

(75) Inventor: Huy Vo, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/438,634

(22) Filed: Apr. 3, 2012

(65) Prior Publication Data

US 2012/0188828 A1 Jul. 26, 2012

Related U.S. Application Data

(63) Continuation of application No. 12/565,655, filed on Sep. 23, 2009, now Pat. No. 8,164,975.

(51) Int. Cl.
*G11C 8/00* (2006.01)

(52) U.S. Cl.
USPC ........... 365/233.1; 365/193; 365/233.13; 365/233.18; 711/167; 713/500

(58) Field of Classification Search
USPC ........... 365/233.18, 193, 233.1, 233.13; 711/167; 713/500
See application file for complete search history.

(56) References Cited

U.S. PATENT DOCUMENTS

| | | | |
|---|---|---|---|
| 6,671,787 B2 | 12/2003 | Kanda et al. | |
| 7,436,904 B2 | 10/2008 | Kwak | |
| 7,661,010 B2 * | 2/2010 | DeFazio et al. | 713/500 |
| 7,706,195 B2 | 4/2010 | Lee et al. | |
| 7,888,991 B2 | 2/2011 | Lin | |
| 8,023,358 B2 | 9/2011 | Kim et al. | |
| 8,049,649 B2 | 11/2011 | Moon | |
| 8,055,930 B2 | 11/2011 | Bae et al. | |
| 2011/0069560 A1 | 3/2011 | Vo | |

* cited by examiner

*Primary Examiner* — Harry W Byrne
*Assistant Examiner* — Lance Reidlinger
(74) *Attorney, Agent, or Firm* — Dorsey & Whitney LLP

(57) ABSTRACT

Embodiments of a data capture system and method may be used in a variety of devices, such as in memory controllers and memory devices. The data capture system and method may generate a first set of periodic signals and a second set of periodic signals that differs from the first set. Either the first set of periodic signals or the second set of periodic signals may be selected and used to generate a set of data capture signals. The selection of either the first set or the second set may be made on the basis of the number of serial data digits in a previously captured burst of data. The data capture signals may then be used to capture a burst of serial data digits.

21 Claims, 7 Drawing Sheets

DATA CAPTURE SYSTEM AND METHOD, AND MEMORY CONTROLLERS AND DEVICES

CROSS REFERENCE TO RELATED APPLICATION(S)

This application is a continuation of U.S. patent application Ser. No. 12/565,655, filed Sep. 23, 2009, U.S. Pat. No. 8,164,975, which application and patent are herein by reference, in their entirety, for any purpose.

TECHNICAL FIELD

Embodiments of this invention relate to digital integrated circuits, and, more particularly, to systems and methods for correctly capturing serial data bursts in an integrated circuit device.

BACKGROUND OF THE INVENTION

Digital data is often coupled to integrated circuit devices, such as memory devices, in the form of one or more bursts of serial data. For example, memory devices may have 4 or 8 data bus terminals, each of which transmits or receives a specific number of data bits at the same time the other data bus terminals transmit or receive corresponding bits. For example, a first set of 8 write data bits may be applied to the 8 data bus terminals in parallel, followed by a second set of 8 bits, and so forth, until an eighth and final set of 8 write data bits have been applied to the data bus terminals.

As each burst of 8 write data bits is applied to the data bus terminals, the data bits are stored in respective latches responsive to a DQS signal, which is normally applied to the memory device along with the write data. Each bit of the write data may be applied to the data bus terminals at the same frequency as, and in synchronism with, a system clock signal. The transitions of the DQS signal are normally offset 90 degrees from the system clock signal so that the transitions of the DQS signal occur midway between the transitions of the system clock, and can be used to capture the write data in the memory device.

As the data bandwidth of memory devices has continued to increase, the need to transfer data at a faster rate has resulted in the development of memory devices that apply more than one write data bit to each data bus terminal during each period of the system clock signal. For example, memory devices known as double data rate ("DDR") devices may capture write data on both the rising and falling edge transitions of the DQS signal. As a result, two write data bits can be captured at each data bus terminal during each period of the system clock signal.

Although the use of DDR techniques has been successful in significantly increasing the data bandwidth of memory devices, the need exists to transfer data at rates that are even faster than the rate at which data can be received and transmitted by DDR memory devices. As a result, DDR2 and DDR3 memory devices have been developed that receive and transmit data at even faster speeds. However, as clock speeds and resulting data rates have increased, the "data eye" during which the write data can be properly captured by a DQS signal transmitted to a memory device along with the write data has continued to decrease, thus making it more difficult to properly capture write data. One approach that has been proposed is to frequency divide the DQS signal and then generate multiple phases of the frequency-divided signal, such as 4 phases to generate DQS0-3 signals.

In operation of a memory device, write data capture may begin a specific latency period after a write command has been applied to a memory device in synchronism with the system clock signal. For example, the latency may be 6 transitions of the system clock signal. After the latency period has expired, a write signal may become active in synchronism with the system clock signal. Write data capture may then begin on the first rising edge of the DQS0-3 signal following the write signal becoming active. The first rising edge of one of the DQS0-3 signals is not necessarily a rising edge of the DQS0 signal. Instead, any one of the four DQS signals can be the first to transition high after the write signal becomes active. As a result, the first data bit that is captured in the memory device may be other than the DQ0 bit.

Despite the data bandwidth increases resulting from the transition from DDR to DDR2 and from DDR2 to DDR3, the need exists for still higher data bandwidths. Yet, significant problems can be encountered in attempting to transfer data at a faster rate, some of which are discussed below. Furthermore, although this discussion of the need to increase data bandwidth has been in the context of memory devices, a similar need exists for other types of digital electronic devices. Thus, there is a need for a technique for transferring data at an even faster rate.

DETAILED DESCRIPTION

One approach to increasing the data bandwidth beyond that achieved by DDR3 is to use data strobe signals having a higher frequency than the system clock frequency. For example, if the DQS signal had twice the frequency of the system clock signal, then 4 write data bits could be applied to each data bus terminal during each period of the system clock signal. Memory devices using this technique may be referred to as DDR4 memory devices. However, increases in the frequency of system clock signals may result in the "data eye" becoming too short to accurately capture the write data bits. Therefore, increasing system clock frequencies may make it difficult or impossible to accurately capture write data.

One approach to allowing use of DQS signals that are twice the frequency of the system clock signal may be used in DDR4 memory devices to divide the DQS signals by 2 and then generate 4 phases of the resulting half frequency signal. This approach results in 4 PH0-3 signals having the same frequency as the system clock signal, and it therefore provides the same internal "data eye" as the DQS signals in DDR3 memory devices. However, as shown in FIG. 1, each transition of the double frequency DQS signal still coincides with the rising edge of one of the PH0-3 signals so that a data bit is captured during each transition of the DQS signal.

Figure 2:
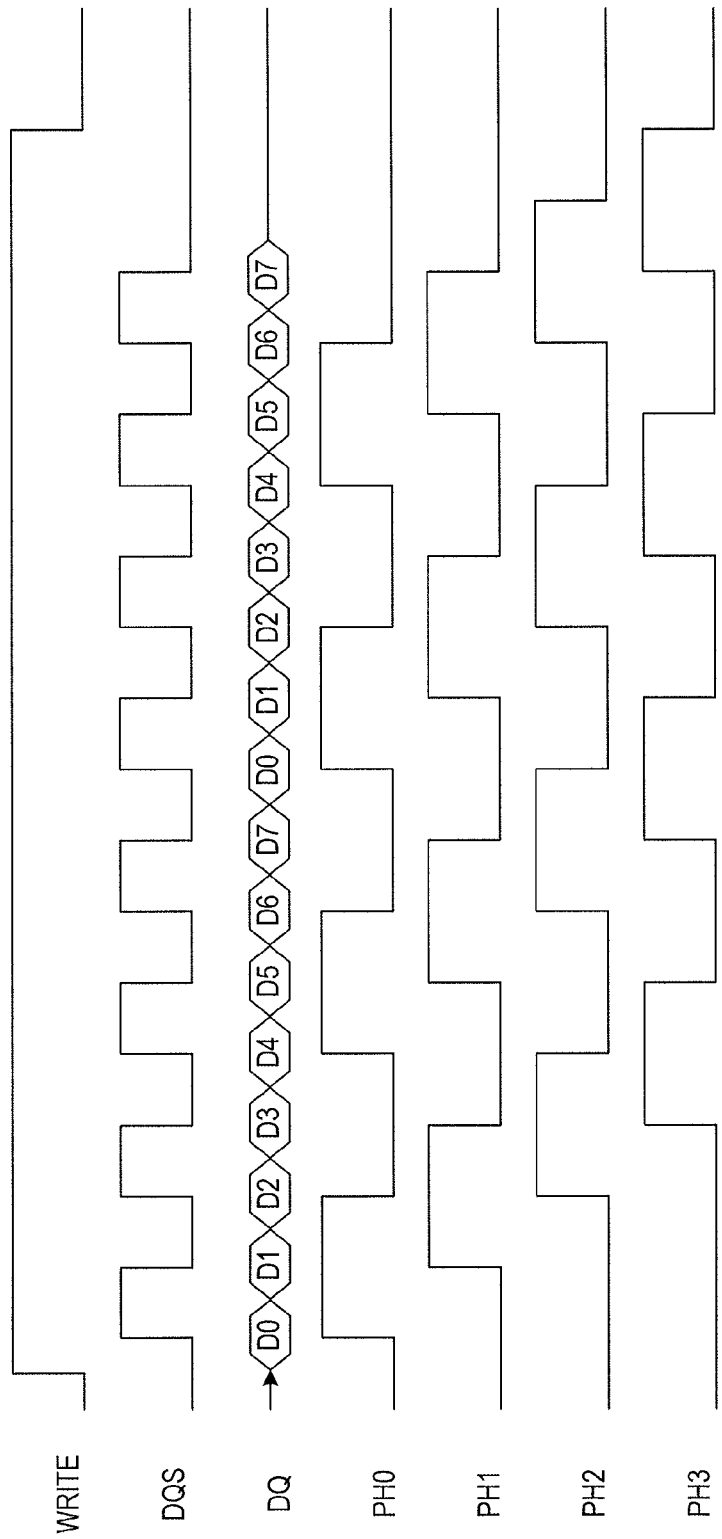
FIG. 2 is a timing diagram showing signals that may be present in a data capture system.

Although using 4 PH0-3 signals having half the frequency of the DQS signal may reduce the problem of an excessively short "data eye," it can create other problems. With reference to FIG. 2, capturing 64 bits of write data (i.e., 8 bits at each of 8 data bus terminals) followed by capturing another 64 bits of write data does not result in any problem because the PH0 signal will capture the first bit DQ0 of the second burst of 8-bits immediately after the PH3 signal captures the seventh bit DQ7 of the first burst of 8-bits. Thus the PH0-3 signals can correctly store the DQ0-7 bits of the second burst in a latch after the DQ0-7 bits of the first burst have been stored in the latch.

Figure 1:
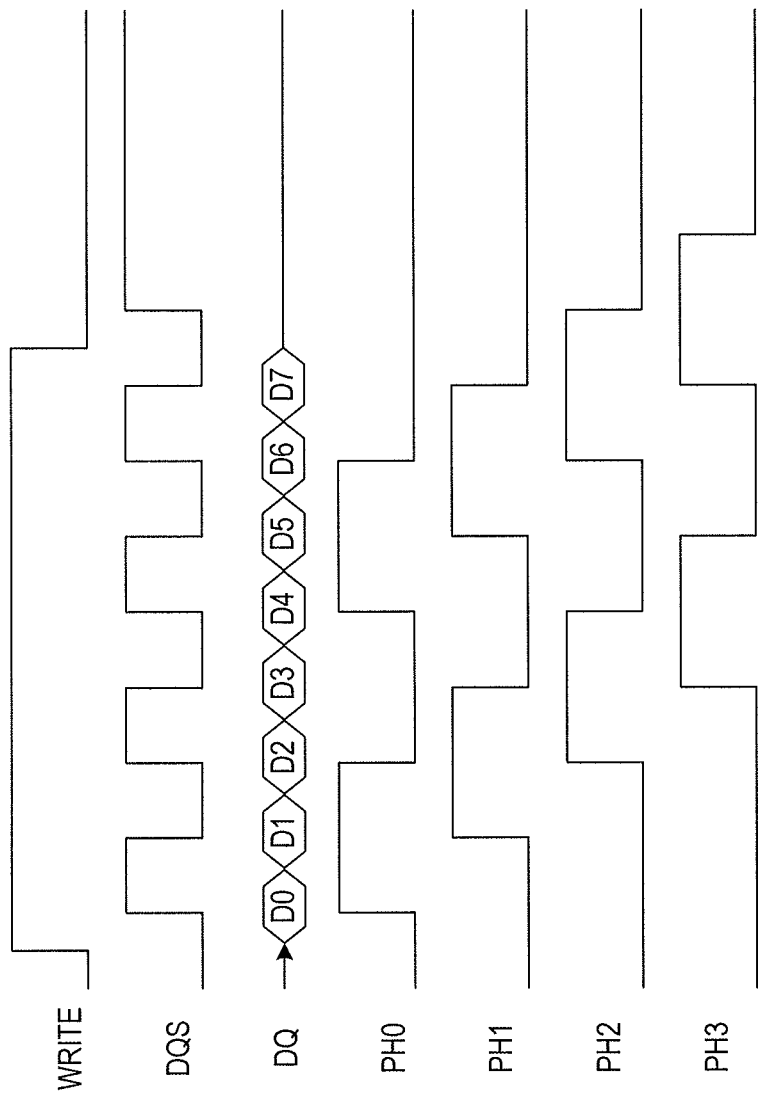
FIG. 1 is a timing diagram illustrating how serial data bits may be captured by respective phases of a frequency divided strobe signal.
Figure 3:
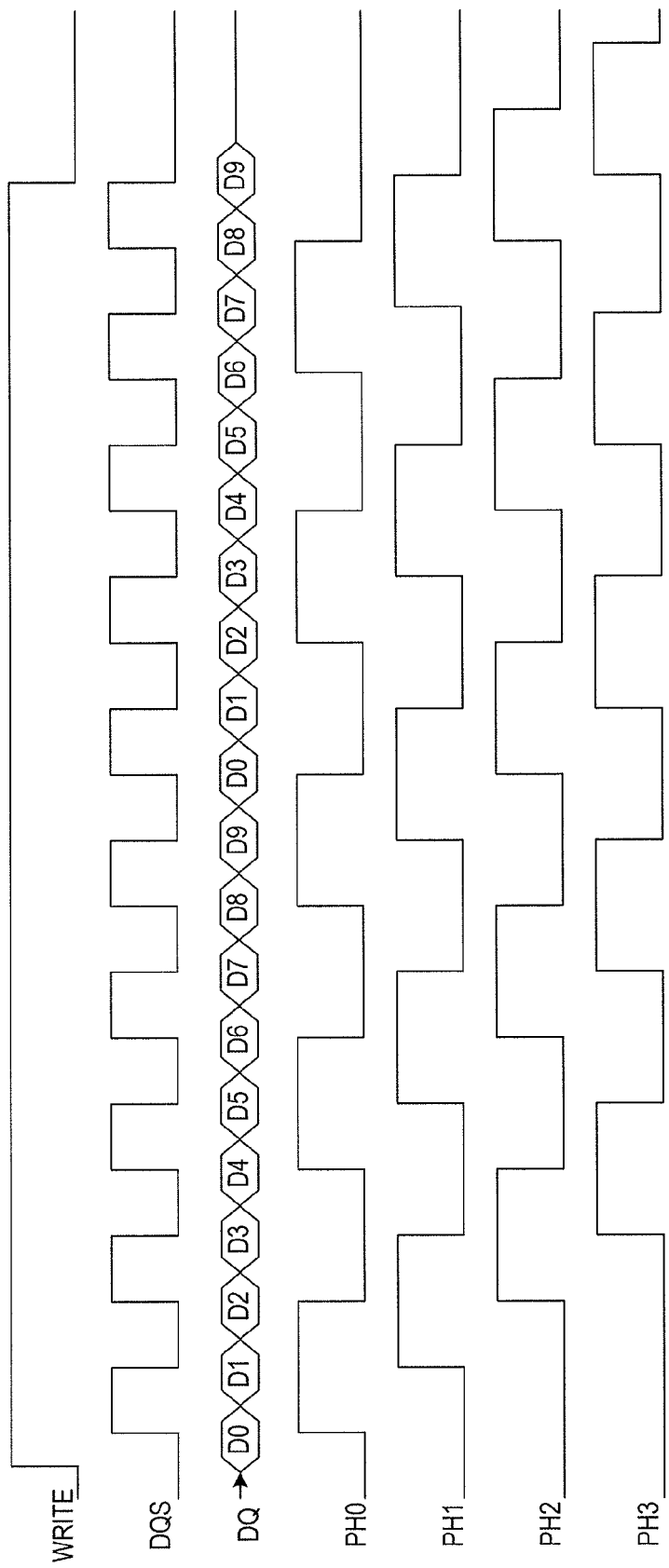
FIG. 3 is a timing diagram showing other signals that may be present in a data capture system.
Figure 4:
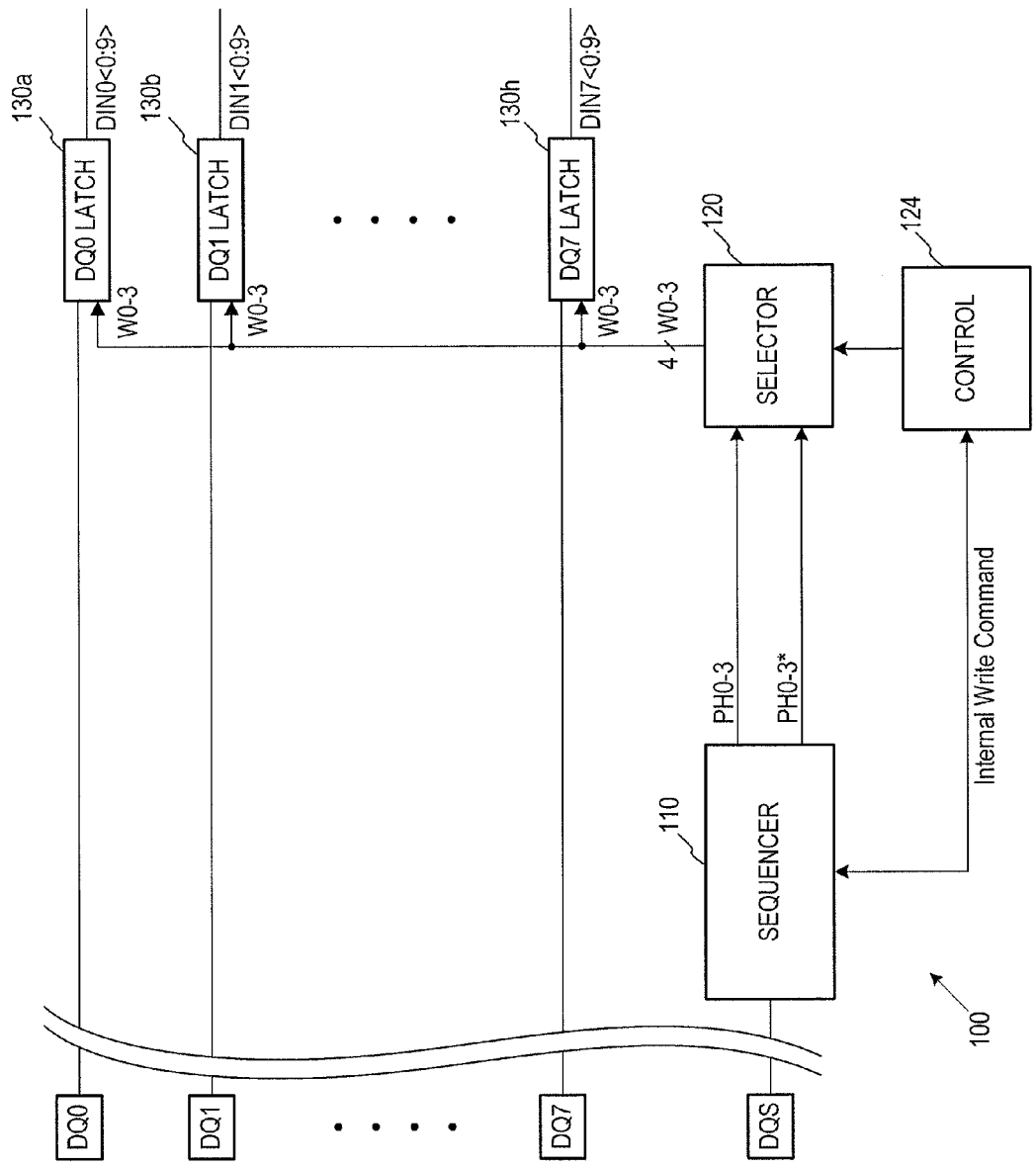
FIG. 4 is a block diagram of a data capture system according to an embodiment of the present invention.

Although FIGS. 1 and 2 illustrate the lack of any problems when write data are applied to the data bus terminals in serial bursts of 4 bits and multiples of 4 bits, such as 8 data bits, a problem may exist if write data are applied to the data bus terminals in serial bursts of other than 4 bits. For example, as shown in FIG. 3, some memory devices may receive write data in bursts of either 8 write data bits applied to each data bus terminal or 10 write data bits applied to each data bus terminal. When 10 write data bits are applied to each data bus terminal, the first 4 bits may be captured during the first system clock period, and the second 4 bits may be captured during the second system clock period. However, 4 write data bits may also be captured during the third system clock period even though the first two of these captured bits are the last two bits of the first burst of write data bits, and the last two of these captured bits are the first two bits of the second burst of write data bits. Therefore, as shown in FIG. 4, the first rising edge of the PH0 signal captures the DQ0 bit at the start of the period when the write signal is active and stores the data bit in the DQ0 bit location of the latch. Similarly, the third rising edge of the PH1 signal captures the DQ9 bit and correctly stores it in a DQ9 bit location of the latch just before the DQ0 bit for the next burst of write data are applied to the respective data bus terminals. As a result, the rising edge of the PH2 signal that immediately follows the rising edge of the PH1 signal will capture the DQ0 bit of the next burst of data and improperly store the data in the DQ2 bit location of the latch. This situation may present a problem since the location of the latch (not shown) that should store the DQ2 bit will then be storing the DQ0 bit. Additionally, the bit location of the latch that should store the DQ3 bit will instead store the DQ1 bit, the bit location of the latch that should store the DQ4 bit will instead store the DQ2 bit, and so forth.

One example of a system 100 for solving this problem is illustrated in FIG. 4. The system 100 includes a sequencer 110 that receives the DQS signal and divides the DQS signal by two and generates signals PH0-3 that are at four phases of the divided signal. However, the sequencer 110 also generates signals PH0-3* that are at four phases of the complement of the PH0-3 signals, respectively. The sequencer 100 applies both the PH0-3 and the PH0-3* signals to a selector 120. The selector 120 under control of a controller 124 selects either the PH0-3 or the PH0-3* signals, and generates write latch signals W0-3 corresponding to the selected signals. In the event a burst of 10 data bits is applied to each of the eight data bus terminals, the 120 selector initially applies W0-3 signals corresponding to the PH0-3 signals to each of a set of eight 10-bit write latches 130a-h. After the first 10 bits have been captured from each data bus terminal DQ, the selector 120 applies W0-3 signals corresponding to the PH0-3* signals to the latches 130a-h to capture the data in the next 8-bit or 10-bit burst. Thus, the first bit of the first burst is captured as the first bit location and is output as bit DIN<0> in each of the latches 130a-h, and the first bit of the second burst is also correctly captured as the first bit location and is output as bit DIN<0> in each of the latches 130a-h. If the selector 120 did not switch from using the PH0-3 signals to using the PH0-3* signals to generate the W0-3 signals, the first bit of the second burst would be incorrectly captured at the third bit location and it would be output as bit DIN<2> in each of the latches 130a-h.

Figure 5:
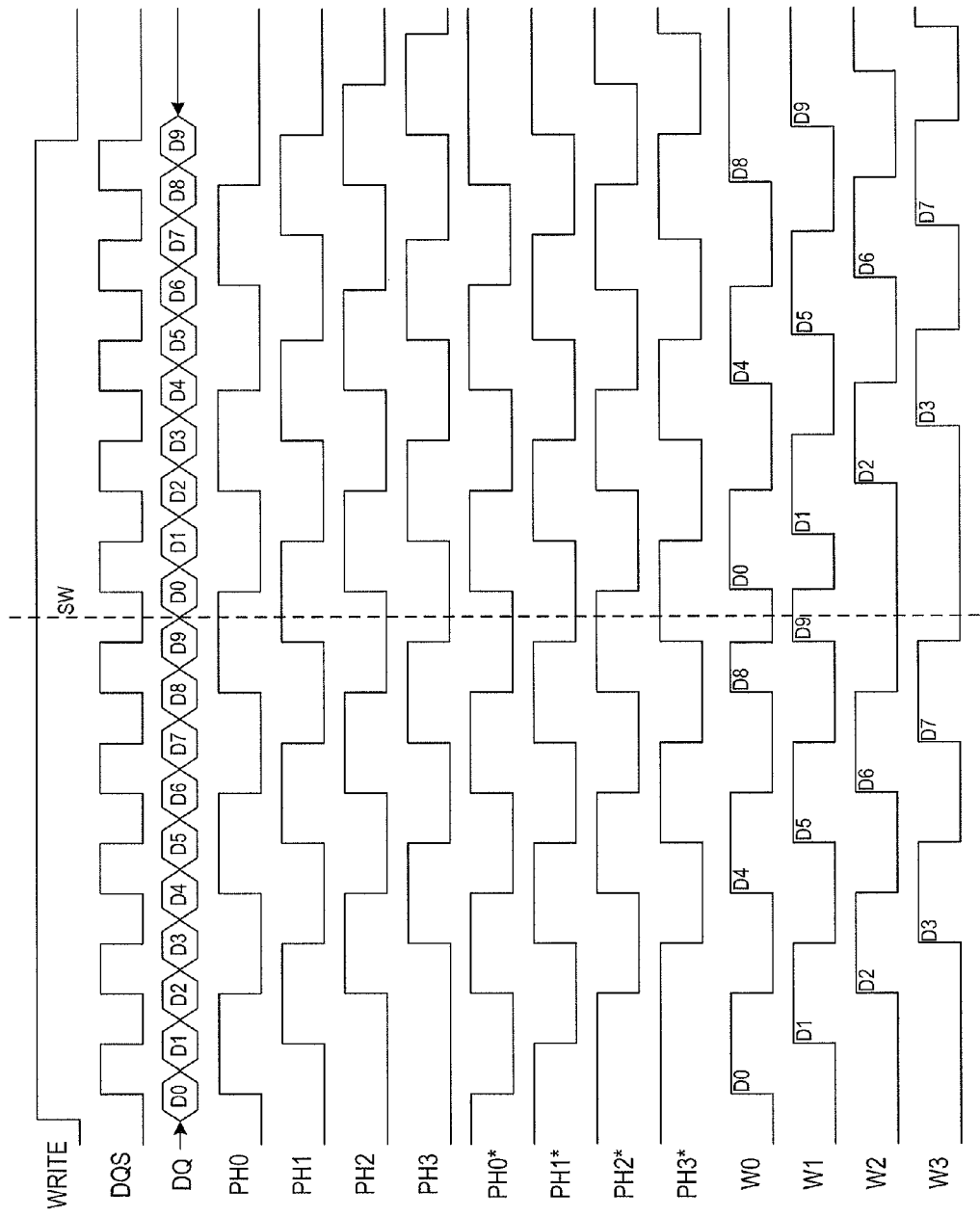
FIG. 5 is a timing diagram showing signals that are present in a data capture system of FIG. 4.

As shown in FIG. 5, the first rising edge of the W0 signal corresponding to PH0 signal captures the first bit D0 of the first burst of 10 data bits, and the third rising edge of the W1 signal corresponding to the PH1 signal captures the last bit D9 of the first burst of 10 data bits. The selector 120 then selects the PH0-3* signals for use as the W0-3 signals at a time designated by the line SW in FIG. 5. The first rising edge of the W0 signal corresponding to PH0* signal therefore captures the first bit D0 of the second burst of 10 data bits, and the third rising edge of the W1 signal corresponding to the PH1* signal captures the last bit D9 of the second burst of 10 data bits. Thus, unlike in the example shown in FIG. 3, since the first bit D0 of the second burst of 10 data bits is captured by the PH0* signal, it is stored in the correct location in the latch for receiving the D0 bit.

Although the principle embodied in the data capture system 100 is illustrated with each of the latches 130a-h configured to capture 10 data bits using 4 data capture signals having respective phases, it can be generalized to any data capture system in which latches are configured to capture M data bits using N data capture signals having respective phases, where M and N are each a positive integer. If M/N is an integer, then it may not be necessary for the controller 124 to generate a control signal that causes the selector 120 to switch from selecting one of the sets of periodic signals PH0-3 or PH0-3* to the other of the sets of periodic signals PH0-3* or PH0-3, respectively. However, if M/N is not an integer, then it may be necessary for the selector 120 to switch from selecting one set of periodic signals to the other so that the first bit of the subsequent burst will be correctly stored in the first location in the respective latch 130.

Figure 6:
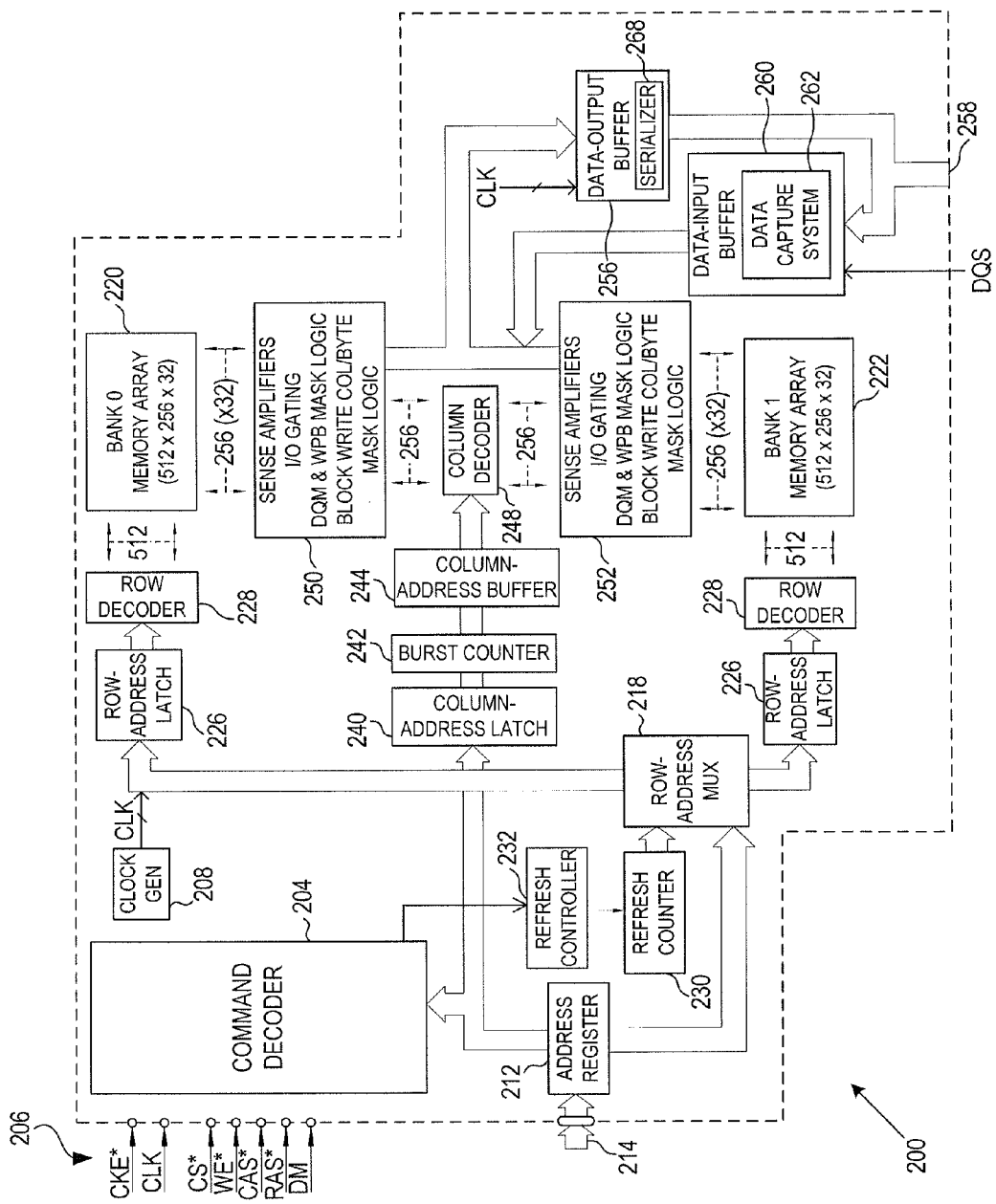
FIG. 6 is a block diagram of an embodiment of a memory device using an embodiment of a data capture system.

The data capture system 100 or a data capture system according to some other embodiment may be used in a wide variety of applications. For example, data capture system embodiments may be used in data input buffers, such as data input buffers used in a memory device as shown in FIG. 6. The memory device may be a conventional double data rate dynamic random access memory ("DDR DRAM") 200 including a command decoder 204 for controlling its operation responsive to high-level command signals received on a control bus 206. The command decoder 204 may generate a sequence of command signals responsive to the high level command signals to carry out the function (e.g., a read or a write) designated by each of the high level command signals. The DDR DRAM may also include a clock generator 208 configured to generate a system clock signal CLK.

The DDR DRAM 200 may include an address register 212 that may receive row addresses and column addresses through an address bus 214. The address bus 214 may be coupled to a memory controller (not shown in FIG. 6). A row address may first be received by the address register 212 and applied to a row address multiplexer 218. The row address multiplexer 218 may couple the row address to a number of components associated with either of two memory banks 220, 222 depending upon the state of a bank address bit forming part of the row address. A respective row address latch 226 may be associated with each of the memory banks 220, 222 for storing the row address. A row decoder 228 may decode the row address and apply corresponding signals to one of the banks 220 or 222. The row address multiplexer 218 may also couple row addresses to the row address latches 226 for the purpose of refreshing the memory cells in the banks 220, 222. The row addresses may be generated for refresh purposes by a refresh counter 230, which may be controlled by a refresh controller 232. The refresh controller 232 may, in turn, be controlled by the command decoder 204.

After the row address has been applied to the address register 212 and stored in one of the row address latches 226, a column address may be applied to the address register 212. The address register 212 may couple the column address to a column address latch 240. Depending on the operating mode of the DDR DRAM 200, the column address may be either coupled through a burst counter 242 to a column address buffer 244, or to the burst counter 242, which may apply a sequence of column addresses to the column address buffer 244 starting at the column address output by the address register 212. In either case, the column address buffer 244 may apply a column address to a column decoder 248.

Data to be read from one of the banks 220, 222 may be coupled in parallel form to column circuitry 250, 252, which may include sense amplifiers, I/O gating, DQM & WPB mask logic, block write col/byte mask logic for one of the arrays 220, 222, respectively. The data bits developed by the sense amplifiers may then be coupled in parallel form to a data output buffer 256. The data output buffer 256 may include a serializer 268 configured to convert a plurality of sets of parallel data bits to corresponding bursts of serial data bits, and to apply each burst of serial data bits to each of several data bit terminals 258. The serializer 268 may also receive the CLK signal from the clock generator 208 for serializing the read data. Data to be written to one of the arrays 220, 222 may be coupled from each of the data bus terminals 258 to the data input buffer 260 in serial form. The data input buffer 260 may capture the serial input data using a data capture system 262, which may be the data capture system 100 or a data capture system according to another embodiment. The data capture system 262 also receives an externally applied DQS signal. The serial write data applied to each of the data bit terminals 258 is thus converted to a set of corresponding parallel data to be coupled to the banks 220, 222 in parallel form.

Figure 7:
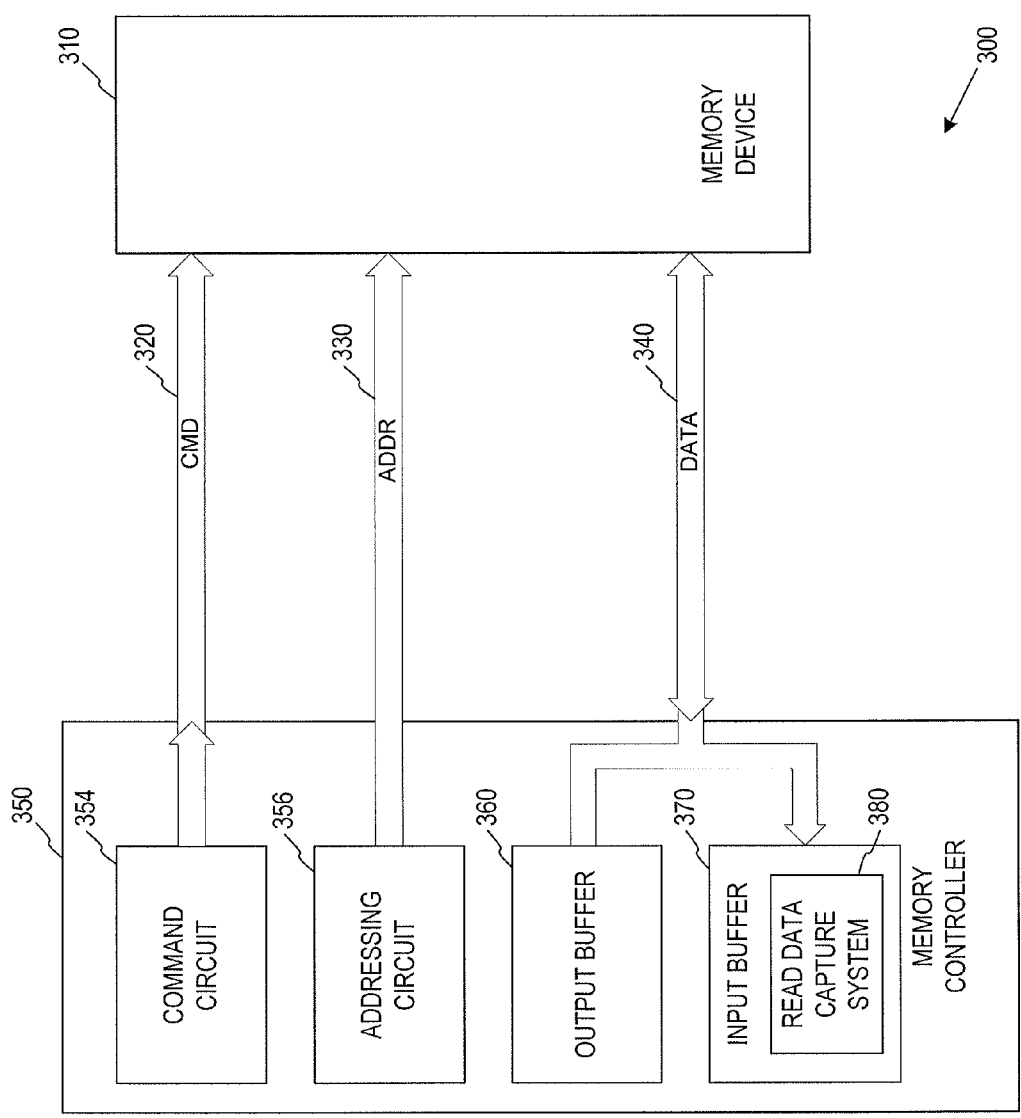
FIG. 7 is a block diagram of an embodiment of a memory system using a memory controller containing an embodiment of a data capture system.

An embodiment of a memory system 300 is shown in FIG. 7. The memory system 300 includes a memory device 310, which may be the memory device 200 shown in FIG. 6, a memory device according to some other embodiment or a conventional memory device. The memory device 310 may be coupled through a command bus 320, address bus 330 and data bus 340 to a memory controller 350. The memory controller 350 may include a command circuit 354 configured to output memory commands, and an addressing circuit 356 configured to output memory addresses. The memory controller 350 may also include an output buffer 360 configured to output write data to the data bus 340, and a data input buffer 370 configured to receive read data from the data bus 340. The data input buffer 370 may include a read data capture system 380 configured to capture a burst of serial read data bits at each of a plurality of terminals of the data bus 340. The read data capture system 380, which may also receive an externally applied DQS signal, may be the data capture system 100 or a data capture system according to another embodiment.

Although the present invention has been described with reference to the disclosed embodiments, persons skilled in the art will recognize that changes may be made in form and detail without departing from the invention. For example, the term "bit" is used herein to describe a single binary digit. However, in other embodiments digits other than binary digits may be used. Such modifications are well within the skill of those ordinarily skilled in the art. Accordingly, the invention is not limited except as by the appended claims.

We claim:

1. A system, comprising:
   a sequencer configured to generate a first set of signals having respective phases relative to a clock signal and a second set of signals having different respective phases relative to the clock signal;
   a selector configured to select either the first or second set of signals to capture write data; and
   a controller coupled to the selector and configured to control the selector to select one of the first or second sets of signals to capture a first burst of write data and to select the other of the first or second sets of signals to capture a second burst of write data.

2. The system of claim 1, wherein the second set of signals are complementary to the first set of signals.

3. The system of claim 1, wherein the sequencer is configured to generate the first set of signals from a divided signal having a frequency that is one-half a frequency of the clock signal.

4. The system of claim 1, wherein the sequencer is configured to generate the first set of signals including four signals and to generate the second set of signals having four signals.

5. The system of claim 1, wherein the selector is configured to alternate between the first and second sets of signals to capture write data.

6. The system of claim 1, wherein the sequencer is configured to generate the first set of signals to have respective phases evenly divided over two clock periods of the clock signal and configured to generate the second set of signals to have respective phases evenly divided over two clock periods of the clock signal.

7. The system of claim 1, wherein the sequencer is configured to generate the first set of signals to have respective phases corresponding to transitions of the clock signal over two clock periods.

8. The system of claim 1, wherein the sequencer is configured to generate the first set of signals to have N signals, and wherein the N signals are used to capture M data bits of write data and (M/N) is not an integer.

9. The system of claim 1, wherein the controller is configured to cause the selector to switch between the first and second sets of signals to capture the M data bits of write data when (M/N) is not an integer and further configured to not cause the selector to switch between the first and second sets of signals to capture the M data bits of write data when (M/N) is an integer.

10. A system, comprising
    a sequencer configured to provide a plurality of periodic signals and a corresponding plurality of complementary periodic signals;
    a selector coupled to the sequencer and configured to provide latch signals based at least in part on the plurality of periodic signals or based at least in part on the plurality of complementary periodic signals; and
    a controller coupled to the sequencer and the selector, the controller configured to cause the selector to provide latch signals based at least in part on the plurality of periodic signals or to provide latch signals based at least in part on the plurality of complementary periodic signals.

11. The system of claim 10, wherein the controller is configured to cause the selector to provide latch signals based at least in part on the plurality of periodic signals or to provide latch signals based at least in part on the plurality of complementary periodic signals based on a number of bits of write data to be captured by the latch signals.

12. The system of claim 10, wherein the controller is configured to cause the selector to alternate between providing latch signals based at least in part on the plurality of periodic signals and providing latch signals based at least in part on the plurality of complementary periodic signals responsive to the number of bits of write data to be captured by the latch signals not being a multiple of number of latch signals provided by the selector.

13. The system of claim 10, further comprising latches configured to receive the latch signals and capture write data responsive thereto.

14. The system of claim 10, wherein the sequencer is configured to provide the plurality of periodic signals having respective phases that differ equally from each other over two clock cycles of a data strobe signal.

15. The system of claim 14, wherein rising edges of the plurality of periodic signals correspond to transitions of the data strobe signal.

16. A method of operating a data capture circuit, comprising:
    capturing first write data responsive to a first set of periodic signals or a second set of periodic signals, wherein the second set of periodic signals are the complement of the first set of periodic signals; and
    switching to the other set of periodic signals to capture second write data.

17. The method of claim 16, wherein the first and second sets of periodic signals are based at least in part on a data strobe signal.

18. The method of claim 17, wherein the first set of periodic signals includes signals that are at four phases over two clock cycles of the data strobe signal.

19. The method of claim 17, wherein switching to the other set of period signals comprises alternating between the first and second sets of periodic signals to capture sequentially provided write data.

20. The method of claim 16, further comprising:
    dividing a frequency of a data strobe signal by two to provide a divided signal; and
    generating signals that are at four phases of the divided signal for the first set of periodic signals.

21. The method of claim 20, wherein switching to the other set of periodic signals to capture second write data is responsive to (M/N) not being an integer, wherein M is a number of bits of the first write data and N is a number of signals in the first set of periodic signals.

* * * * *

UNITED STATES PATENT AND TRADEMARK OFFICE
CERTIFICATE OF CORRECTION

PATENT NO. : 8,625,385 B2
APPLICATION NO. : 13/438634
DATED : January 7, 2014
INVENTOR(S) : Huy Vo Page 1 of 1

It is certified that error appears in the above-identified patent and that said Letters Patent is hereby corrected as shown below:

In the Specification

In column 1, line 10, after "are" insert -- incorporated --.

In the Claims

In column 6, line 43, in Claim 9, delete "claim 1," and insert -- claim 8, --, therefor.

Signed and Sealed this
First Day of April, 2014

Michelle K. Lee
*Deputy Director of the United States Patent and Trademark Office*